United States Patent [19]
Blakely

[11] 3,955,023
[45] May 4, 1976

[54] BLACK DIELECTRIC MASK ON WHITE SUBSTRATE

[75] Inventor: John Alexander Blakely, Lakewood, Colo.

[73] Assignee: Texas Instruments Incorporated, Dallas, Tex.

[22] Filed: Nov. 1, 1974

[21] Appl. No.: 520,071

[52] U.S. Cl................................ 428/201; 428/209; 428/469; 428/539
[51] Int. Cl.² ...................... B32B 3/00; B32B 7/14
[58] Field of Search ........... 428/539, 469, 472, 201, 428/209, 210

[56] References Cited
UNITED STATES PATENTS
3,556,843   1/1971   Buck .................................. 428/469

Primary Examiner—Michael F. Esposito
Attorney, Agent, or Firm—Harold Levine; James T. Comfort; Gary C. Honeycutt

[57] ABSTRACT

An improved method is provided for applying a dark dielectric surface to a white substrate as used in headers for light emitting diode displays. Light reflectance is reduced without degrading the insulating properties of the dielectric. A paste comprising fine grain alumina and up to 20% by weight of an oxide or metal powder of either molybdenum or tungsten is applied to an alumina substrate. The substrate is then subjected to a reducing atmosphere, wherein the molybdenum or tungsten material is reduced to a black color. The resulting metal phase forms a dielectric layer of low light reflectance without impairing the insulating properties of the dielectric.

4 Claims, 2 Drawing Figures

3,955,023

BLACK DIELECTRIC MASK ON WHITE SUBSTRATE

FIELD OF THE INVENTION

The present invention relates to treating the surface of a white substrate, and more particularly to an improved method of providing insulating layers for metalization separation which layers mask a white substrate and reduce light reflectance without impairing the dielectric properties of the layers.

PRIOR ART

Visual displays are degraded by interference from reflected light. In display devices in which light emitting elements are located on substrate surfaces, the more common substrates such as white alumina have high background illumination. Attempts at coloring the white substrate to achieve a dark appearance have involved adding a coloring agent to the substrate body. During metalization operations in which display control patterns are formed on the substrate, coloring agents have caused layers to become porous. Metal plated on top of the layers flowed through the porous layer to form electrical shorts. The insulating layers are generally superimposed on the substrate and are employed to separate two or more layers of metalization laid down on the substrate to provide the desired connections between the display elements and the controls therefor.

U.S. Pat. No. 3,791,833 discloses the application of a mixture comprising at least 90% by weight of $Al_2O_3$, 0.1 to 5.0% by weight of CoO, and a component chosen from the group consisting of at least one of $MnO_2$, $Cr_2O_3$, $V_2O_5$ and $Fe_2O_3$, with the total amount of CoO and the component being 1.0 to 10% by weight. A ceramic body is coated with the mixture and subjected to a reducing atmosphere such as hydrogen at elevated temperatures to color the ceramic body black while retaining the insulating property of the body.

U.S. Pat. No. 3,637,435 discloses a method of metalizing ceramic bodies which are glass-free and sintered. The method involves the application of an ink composition comprising a liquid vehicle, aluminum powder, and 60 to 85% by weight of a refractory metal such as molybdenum or tungsten. The ceramic body is then subjected to a hydrogen atmosphere at a temperature of the range 2200° to 3200° F. to yield a metallic layer bonded to the body.

There is no procedure heretofore known to provide a satisfactory substrate for light emitting displays.

SUMMARY OF THE INVENTION

The present invention is directed to reduction of the light reflectance of substrates employed in light emitting displays, wherein a dielectric layer is applied to form a nonconducting layer to which when treated to adhere to the substrate is dark and of low reflectance. More particularly, molybdenum or tungsten in the form of an oxide or a metal powder is evenly dispersed into fine grain $Al_2O_3$. A paste comprising 0–20% by weight of the molybdenum or tungsten material is formed from the mixture and applied to the substrate. The coated substrate is then subjected to a reducing atmosphere such as that produced in a high temperature reducing kiln operating above 1100° C. The metal oxide or powder, except for the $Al_2O_3$, is thereby reduced to a zero oxidation state to form a black nonconducting layer masking the substrate beneath. Preferably two courses of such material are applied per insulating layer to insure against pin holes extending through the insulating layer.

DESCRIPTION OF THE DRAWINGS

For a more complete understanding of the invention and for further objects and advantages thereof references may now be had to the following description taken in conjunction with the accompanying drawings in which.

DESCRIPTION OF PREFERRED EMBODIMENTS

Display devices, whether formed from electrodes plated upon a substrate body or from other electronic devices such as visual light emitting diodes (VLEDs) placed upon a substrate, preferably have a distinct and uniform display pattern in order to be effective. Thus, where white substrates are used, the light reflected by the white substrate tends to degrade the overall visual contrast. Reflectance is minimized by the present invention.

Figure 1:
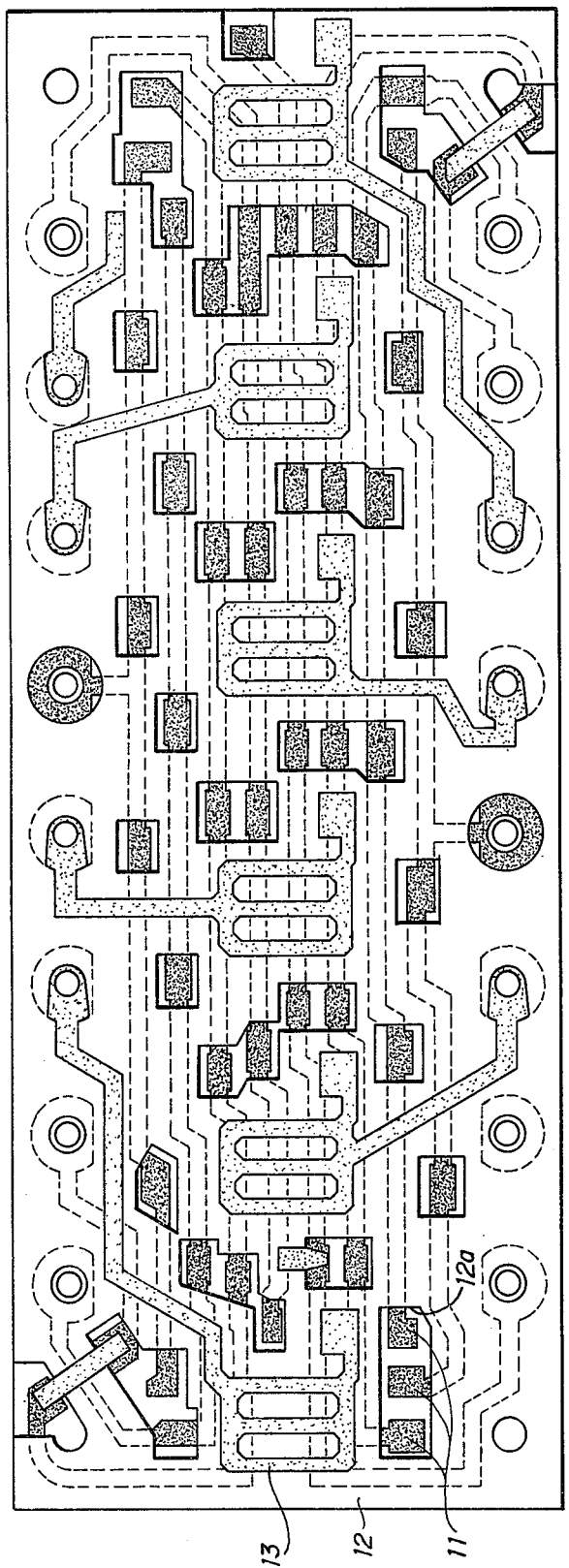
FIG. 1 is a plan view of a typical header for mounting visual light emitting diodes.
Figure 2:
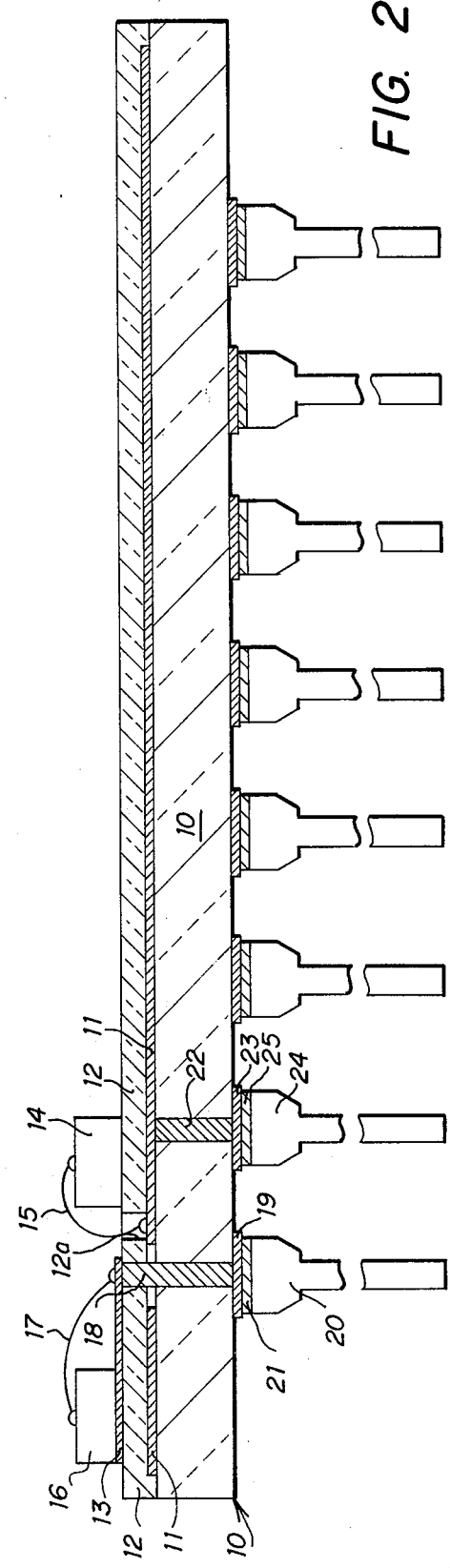
FIG. 2 is a sectional view of a portion of the header of FIG. 1 with light emitting diode units positioned thereon.

FIG. 1 illustrates an embodiment of the invention. In FIG. 1, a rectangular substrate 10 of material such as alumina has a metalization pattern 11 formed thereon in order to provide electrical circuits to which connections may be made at the surface of the completed assembly. The pattern 11 comprises an array of metal bands which lead to various selected connection locations at the surface of the alumina substrate 10. An insulation layer 12 is formed on top of the metalization pattern 11 with windows such as the window 12a extending therethrough. A top layer of metalization forms a pattern 13 on top of the insulation layer 12.

A light emitting diode (LED) assembly 14 has one portion thereof connected by way of a lead 15 to layer 11 within window 12a. A second light emitting diode element 16 is connected by way of lead 17 to the layer 13.

Layer 13 is connected by way of a metalized lead 18 extending through insulation layer 12, metalization layer 11 and the alumina substrate 10 into contact with a pad 19 on the bottom surface of the substrate 10. A terminal 20 is bonded at boundary 21 to the pad 19. In a similar manner, the layer 11 is connected by way of metalized lead 22 extending through a hole in the substrate 10 to a pad 23. A terminal 24 is bonded at boundary 25 to the pad 23.

LED units such as units 14 and 16 are mounted on the top surface of the assembly. In the system of FIG. 1 a six-digit display is accommodated. Each digit display unit may comprise seven discrete bars of LEDs. The various bars may be selectively energized to display numeric symbols. Lead 15, for example, will be understood as being connected to one bar of seven bars in the LED unit 14. Lead 17 similarly is connected to one bar of seven bars in the LED unit 16.

In accordance with the present invention, that portion of the surface area of the assembly on which the LED units 14 and 16 are mounted which is not occupied by the top metalization layer 13 is treated such that the light reflectance is minimized. This is done by employing a mixture comprising molybdenum trioxide or other refractory oxides such as tungsten oxide in fine grain $Al_2O_3$, having a preferable grain size passing through 400 mesh (U.S. Series). The refractory material preferably has a grain size of plus 1 to 6 microns (U.S. Series). The evenly dispersed molybdenum trioxide or tungsten is mixed in proportions of 0–20% by weight with the fine grain $Al_2O_3$ to form a paste by the use of an organic binder such as ethyl cellulose and turpineol. The paste is applied by conventional silk screen procedures to the white ceramic body. The coated body is then treated in a reducing atmosphere such as hydrogen in a reducing kiln operating above 1100° C. The hydrogen atmosphere reduces the metal oxide or powder to a zero oxidation state without vaporizing the metal. The reduction of the metal causes the layer to darken or become black while assuming a metallic form. The metal oxide powder is evenly dispersed throughout the fine grain $Al_2O_3$. The resultant metallic layer is discontinuous and thus not conductive. Accordingly, the light reflectance of the ceramic body is substantially reduced without compromising the insulating properties of the substrate.

In one application of the invention, a pebble mill was used to evenly disperse molybdenum trioxide into a quantity of fine grain $Al_2O_3$. A paste was then mixed therefrom using standard well-known procedures. The mixture comprised 1.53% by weight of molybdenum trioxide and 98.47% by weight of $Al_2O_3$. The resulting paste was applied to a 94% $Al_2O_3$ body and subjected to a hydrogen atmosphere at a temperature slightly above 1100° C. A dark substrate appearance was thereby achieved on the alumina substrate without degrading the insulating properties of the black dielectric layer.

Having described the invention in connection with certain specific embodiments thereof, it is to be understood that further modifications may now suggest themselves to those skilled in the art and it is intended to cover such modifications as fall within the scope of the appended claims.

What is claimed is:

1. A display supporting substrate which comprises a base layer of $Al_2O_3$ having at least one metalization layer patterned thereon and covered by at least one insulation layer comprising a layer of $Al_2O_3$ mixed with up to 20% by wt. of one of the group consisting of (1) molybdenum, (2) tungsten, (3) molybdenum oxide, and (4) tungsten oxide.

2. The combination as set forth in claim 1 in which said insulating layer is formed of at least two separately deposited layers of the same mixture.

3. The combination set forth in claim 1 in which a plurality of metalization layers are formed on said substrate and are separated one from another by one of said insulation layers.

4. The combination set forth in claim 3 in which each of said insulation layers is comprised of two separately deposited layers of said mixture.

* * * * *